United States Patent
Bowen et al.

(10) Patent No.: US 11,941,340 B2
(45) Date of Patent: Mar. 26, 2024

(54) CROSS-HIERARCHY ANTENNA CONDITION VERIFICATION

(71) Applicant: INTERNATIONAL BUSINESS MACHINES CORPORATION, Armonk, NY (US)

(72) Inventors: Michael Alexander Bowen, Poughkeepsie, NY (US); Gerald L Strevig, III, Cedar Park, TX (US); Amanda Christine Venton, Austin, TX (US); Robert Mahlon Averill, III, Wappingers Falls, NY (US); Adam P. Matheny, Hyde Park, NY (US); David Wolpert, Poughkeepsie, NY (US); Mitchell R. DeHond, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 359 days.

(21) Appl. No.: 17/402,710

(22) Filed: Aug. 16, 2021

(65) Prior Publication Data

US 2023/0051392 A1    Feb. 16, 2023

(51) Int. Cl.
*G06F 30/39* (2020.01)
*G06F 30/398* (2020.01)

(52) U.S. Cl.
CPC .................................. *G06F 30/398* (2020.01)

(58) Field of Classification Search
USPC ......... 716/110, 111, 112, 113, 118, 119, 120
See application file for complete search history.

(56) References Cited

U.S. PATENT DOCUMENTS 5,987,240 A    11/1999  Kay
6,009,250 A    12/1999  Ho et al.
(Continued)

FOREIGN PATENT DOCUMENTS

| CN | 108897933 A | 11/2018 |
| CN | 111950226 A | 11/2020 |
| WO | 2016060544 A1 | 4/2016 |

OTHER PUBLICATIONS

IPCOM000199907D, "A pseudo hierarchy approach for improved performance and reduced logic overhead in very high speed processors," Disclosed Anonymously, Sep. 21, 2010, 7 pages.

*Primary Examiner* — Brian Ngo
(74) *Attorney, Agent, or Firm* — CANTOR COLBURN LLP; Kelsey M. Skodje

(57) ABSTRACT

Aspects of the invention include methods, systems, and computer program products for integrated circuit development using cross-hierarchy antenna condition verification. A method includes obtaining a design of a hierarchical macro distributed between multiple files for an integrated circuit and analyzing, by a design verification tool, a route between at least one child macro and at least one pin of the hierarchical macro as defined in the files. The method further includes determining, by the design verification tool, a plurality of connection characteristics of the at least one child macro and the at least one pin forming the route and calculating, by the design verification tool, an antenna condition for the route based on the connection characteristics. The design of the hierarchical macro is adjusted to remove a violation of an antenna rule based on determining that the antenna condition of the route violates the antenna rule.

20 Claims, 9 Drawing Sheets

(56) References Cited

U.S. PATENT DOCUMENTS

| | | |
|---|---|---|
| 7,073,148 B1 | 7/2006 | Jenkins |
| 7,103,863 B2 | 9/2006 | Riepe et al. |
| 7,302,654 B2 | 11/2007 | Lakshmanan et al. |
| 8,839,177 B1 * | 9/2014 | Aubel .................. G06F 30/392 |
| | | 716/132 |
| 9,378,329 B1 | 6/2016 | Henderson et al. |
| 2004/0078767 A1 * | 4/2004 | Burks ................. G06F 30/3315 |
| | | 716/113 |

* cited by examiner

CROSS-HIERARCHY ANTENNA CONDITION VERIFICATION

BACKGROUND

The present invention generally relates to integrated circuit development, and more specifically, to integrated circuit development using cross-hierarchy antenna condition verification.

The development of an integrated circuit (i.e., chip) involves several stages from design through fabrication. The chip may be subdivided into hierarchical levels to simplify design and testing tasks at different stages. Generally, a cell or macro may be regarded as a sub-section of the chip. For example, each macro may comprise a number of cells. Once the design is finalized, tests may be completed to ensure that design rules established by a foundry are met prior to fabrication. Once a hierarchical design is reduced to a flat design that integrates all of the nets and components, it is very difficult to make further design changes.

Some issues that can arise in the design of an integrated circuit may not become apparent until manufacturing processes are performed to create the integrated circuit. A particular example of such an issue is the so-called "antenna-effect." The antenna effect (also referred to plasma induced gate oxide damage) can occur during processing due to charge accumulation caused in isolated nodes of an integrated circuit. The accumulation is typically due to plasma etching used to remove oxide layers (or other layers) and can cause unwanted damage through/to the gate of a transistor in the integrated circuit. Factors leading to the antenna effect may not be readily identifiable by individually examining each macro or cell.

SUMMARY

Embodiments of the present invention are directed to integrated circuit development using cross-hierarchy antenna condition verification. A non-limiting example computer-implemented method includes obtaining a design of a hierarchical macro distributed between multiple files for an integrated circuit and analyzing, by a design verification tool, a route between at least one child macro and at least one pin of the hierarchical macro as defined in the files. The method further includes determining, by the design verification tool, a plurality of connection characteristics of the at least one child macro and the at least one pin forming the route and calculating, by the design verification tool, an antenna condition for the route based on the connection characteristics. The design of the hierarchical macro is adjusted to remove a violation of an antenna rule based on determining that the antenna condition of the route violates the antenna rule.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As previously noted, integrated circuit development may involve several stages from design through fabrication. As also noted, at one or more stages, the integrated circuit design may be subdivided hierarchically for design or testing tasks. A hierarchical macro can include a parent macro, one or more child macros, and one or more top level terminals. Embodiments include the use of shape information files that describe characteristics of design components, such as metal, via, and gate area information for child macros and parent macros. Use of the parent and child shape info files enables antenna checking to be performed at a specific level of hierarchy without needing to know further details of a designs parent or children. Defining this information in a sharable format between portions of a hierarchical design can support route analysis between routes that span multiple macros to identify potential antenna effect violations when the routes are connected through one or more layers of an integrated circuit design. Upon identifying an antenna effect violation, the design can be adjusted to remove the violation before fabrication occurs.

This approach can identify potential antenna condition violations that may not otherwise become apparent until after a hierarchical design is fully constructed, flattened, and tested. Detection of antenna conditions can be performed iteratively through hierarchical layers of a design to increase design confidence as further layers are built upon the lower layers. Addressing potential antenna violations while the design is still in a hierarchical format can provide flexibility in fixing the antenna condition at a child level or a parent level. Identifying antenna conditions that violate rules and making design adjustments to remove the antenna condition rule violations can reduce the risk of damage within an integrated circuit during fabrication.

Figure 1:
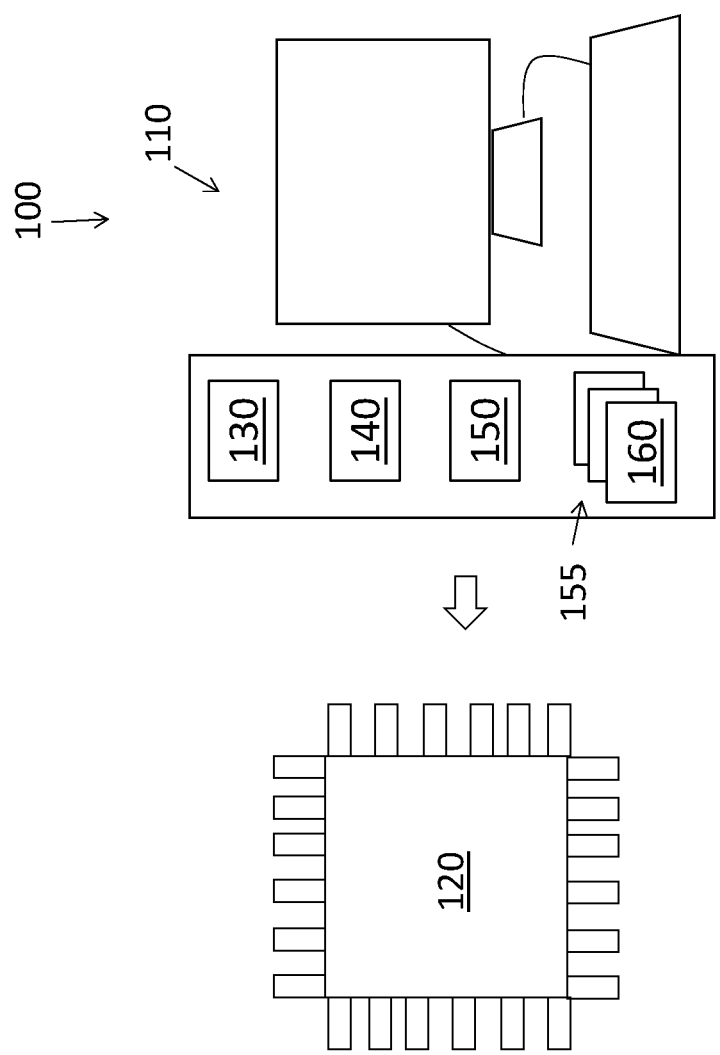
FIG. 1 is a block diagram of a system to perform the development of an integrated circuit using cross-hierarchy antenna condition verification according to one or more embodiments of the invention.

FIG. 1 is a block diagram of a system 100 to perform cross-hierarchy antenna condition verification according to embodiments of the invention. The system 100 includes processing circuitry 110 used to generate a design that is ultimately fabricated into an integrated circuit 120. The steps involved in the fabrication of the integrated circuit 120 are well-known and briefly described herein. Once the physical layout is finalized, based, in part, on cross-hierarchy antenna condition verification according to embodiments of the invention to facilitate optimization of the routing plan, the finalized physical layout is provided to a foundry. Masks are generated for each layer of the integrated circuit based on the finalized physical layout. Then, the wafer is processed in the sequence of the mask order. The processing includes photolithography and etch. This is further discussed with reference to FIG. 9.

In the example of FIG. 1, the system 100 can include a macro design tool 130 used to develop a design 155 of one or more hierarchical macros distributed between multiple files 160 for the integrated circuit 120. The files 160 can be organized in any readable format, such as one or more databases or file systems. The macro design tool 130 can be used to define circuit characteristics of parent macros, child macros, and routes that interconnect multiple macros. The system 100 also includes a design verification tool 140 that can analyze the files 160 and apply verification rules 150 (also referred to as rules 150) to confirm that the macros of the design 155 comply with the verification rules 150 when one or more routes are connected between the macros. The verification rules 150 can include one or more antenna rules that define antenna conditions which cannot be violated in the final design. Such rules can include, but are not limited to: a "metal area antenna rule" that imposes a maximum limit on a ratio of metal line area to connected gates area, a "perimeter antenna rule" that imposes a maximum limit on a ratio of the metal line perimeter connected gates area and a via, or contact area rule that imposes a maximum limit to the ratio of the via or contact area to the connected gates area. Other conditions and rules are contemplated.

Upon detecting an antenna condition that violates an antenna rule for a route based on connection characteristics between two or more child macros and a parent macro forming the route, the design verification tool 140 can adjust the design 155 to remove the violation. Adjustments can include adding antenna cell(s) in the parent to increase the gate/rx area, increasing the size of the failing circuits or modifying a signal routing path through multiple layers of the design 155. If a fix is not practical in the parent, a parent shape information file (parentShapeInfo) 326 (FIG. 3) can be generated. This represents the parents routing plan to the child level of hierarchy. The child antenna checking will then see the problem and can then be adjusted to fix the antenna violation. A child shape information (shapeInfo) file (e.g., child shape information file 324A, 324B of FIG. 3) will then be updated to reflect the design update and be included in the next parent antenna checking run to facilitate optimization of the routing plan. Furthermore, the current parent can be influenced by its parent passing a parentShapeInfo file down to request fixes from above the current parent. After adjustments are made, the files 160 can be updated to reflect the changes to facilitate optimization of the routing plan, and a finalized physical layout can be provided to a foundry. Masks can be generated for each layer of the integrated circuit 120 based on the finalized physical layout. Then, a wafer can be processed in the sequence of the mask order. The processing can include photolithography and etch.

Figure 2:
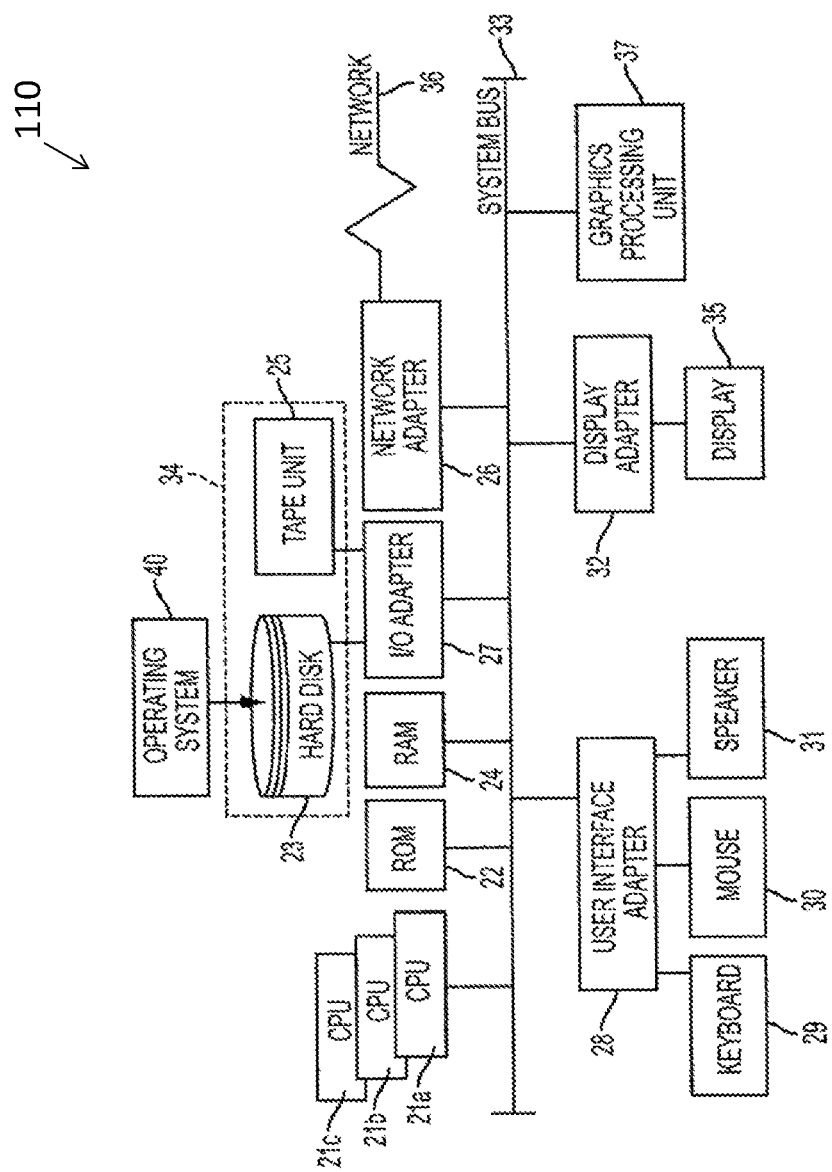
FIG. 2 is a block diagram of a processing system to generate the design that is fabricated into the integrated circuit according to one or more embodiments of the invention.

FIG. 2 is a block diagram of a processing system 110 (also referred to as processing circuitry 110) used to generate the design 155 that is fabricated into the integrated circuit 120. The processing system 110 has one or more central processing units (processors) 21a, 21b, 21c, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of processing system 110.

Further illustrated are an input/output (I/O) adapter 27 and a network adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage drive 25 are collectively referred to herein as mass storage 34. Operating system 40 for execution on processing system 110 can be stored in mass storage 34. The ROM 22, RAM 24, and mass storage 34 are examples of memory 19 of the processing system 110. A network adapter 26 interconnects system bus 33 with an outside network 36 enabling the processing system 110 to communicate with other such systems.

A display (e.g., a display monitor) 35 is connected to system bus 33 by display adapter 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, processing system 110 can include a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, processing system 110 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the processing system 110.

The macro design tool 130 and design verification tool 140 of FIG. 1 are examples of program instructions executable by one or more processors 21 to perform a plurality of operations supporting the creation, verification, and modification of the design 155 of FIG. 1. The verification rules 150 and/or files 160 of FIG. 1 can be stored in the system memory of the processing system 110, such as RAM 24 and/or mass storage 34.

Figure 3:
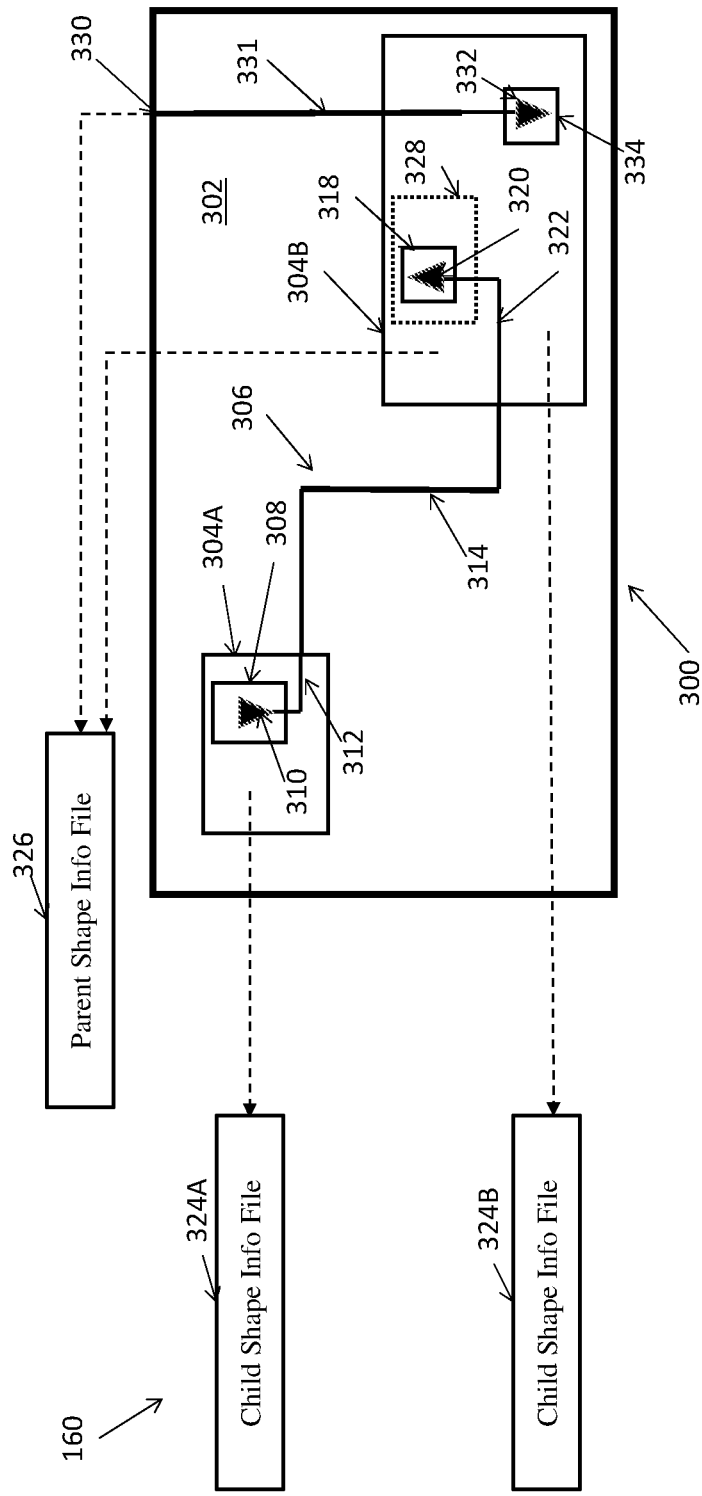
FIG. 3 is a block diagram of a hierarchical macro having multiple child macros and a parent macro according to one or more embodiments of the invention.

Referring now to FIG. 3, a block diagram of a hierarchical macro 300 having a parent macro 302 and multiple child macros 304A, 304B is shown according to one or more embodiments of the invention. The child macros 304A, 304B can include various components, such as logic gates, buffers, and the like. The child macros 304A, 304B are connected by a route 306 through the parent macro 302. Child macro 304A can include a gate area 308 with a source pin 310 that is coupled to a child route 312 of the route 306. The child route 312 can be a metal path within an area reserved for the child macro 304A. The child route 312 can connect to a parent route 314 of the route 306. Child macro 304B can include a gate area 318 with a sink pin 320 that is coupled to a child route 322 of the route 306, where the child route 322 is coupled to an opposite end of the parent route 314 of the route 306 to provide a conductive path between the source pin 310 and the sink pin 320. The child route 322 can be a metal path within an area reserved for the child macro 304B. The parent macro 302 can also include one or more terminals 330 (which may be one or more pins or other such connectors) that are connections to the level of hierarchy above this cell with parent routes 331 that connect to one or more child macros. The parent routes 331 can connect to a source and/or sink in a child of the parent macro 302. In the example of FIG. 3, parent route 331 connects to a sink 332 of child macro 304B at area 334.

Design details of the child macro 304A can be defined in a child shape information file 324A, and the child macro 304B can be defined in a child shape information file 324B. The details of the grandparent (e.g., a hierarchical level above the parent macro 302) can also be defined in a parent shape info file 326. The child shape information files 324A, 324B and the parent shape information file 326 are examples of the files 160 of FIG. 1. A modular development approach can be supported through separation of the design details between shape information files 324A, 324B, and 326, where design changes within the scope of the child macro 304A may not be readily known to the child macro 304B or parent macro 302. In embodiments, the shape information files 324A, 324B, and 326 can define one or more connection characteristics that can be accessed by the design verification tool 140 to discover antenna conditions that may result in violating an antenna rule of the rules 150 when the route 306 is connected or modified. For example, metal, via, gate area, and/or diffusion area can be defined with respect to the source pin 310 of child macro 304A in child shape information file 324A such that upon connecting or checking a connection to the route 306, the potential impacts can be determined by the design verification tool 140. Similarly, metal, via, gate area, and/or diffusion area can be defined with respect to the sink pin 320 of child macro 304B in child shape information file 324B for analysis by the design verification tool 140. Path length information, vias, and distribution of signal paths between layers from the grandparent can be defined in the parent shape information file 326 to support analysis of the parent route 331 through the parent macro 302.

Upon detecting a violation of an antenna rule, the design verification tool 140 can adjust one or more aspects of the hierarchical macro 300. This can include adding antenna cells to the net in the parent or adjusting the path of the route 306 to break up a long signal path and reduce the metal area causing the antenna fail. If it is not practical to fix the fail in this level of hierarchy, then parent shape information files can be generated for child macros 304A and/or 304B so that the problem is visible when performing antenna checking at the child macro level. The children macros can, in addition to the adjustments that could be made at the parent level, increase the size of the circuit (e.g., increase the gate/rx area) to mitigate the antenna fail. When the change is made for a child macro, a change of the shape information of the child macro is re-generated and passed to the parent level such that the problem can be confirmed as resolved. A shape information file will also be generated at the parent level and passed to the grand parent level. Adjustments can be made at a child macro level or a parent macro level depending upon available resources and preferences. For instance, some designs may include fill blocks for otherwise unused space that can be used to expand gate area or diffusion area. Where a child macro 304A, 304B does not have readily available expansion capacity, the parent macro 302 can donate resources to one or more child macros 304A, 304B. Further, the path of route 306 can be modified to break up long signal paths within the same layer of metal as another approach for removing a violation of an antenna rule. In some instances, adjustments can be distributed between the parent macro 302 and one or more of the child macros 304A, 304B. As changes are made to the design of the macros 302, 304A, 304B, the shape information files 326, 324A, 324B are updated accordingly.

Although the example of FIG. 3 depicts a single instance of the parent macro 302 and two child macros 304A, 304B, it will be understood that the parent macro 302 can include many child macros. Further, there can be many instances of the hierarchical macro 300 within the design 155 for fabricating the integrated circuit 120 of FIG. 1. The design verification tool 140 can take a layer-by-layer approach to detect and correct antenna rule violations as further illustrated in the examples of FIGS. 4-7.

Figure 4:
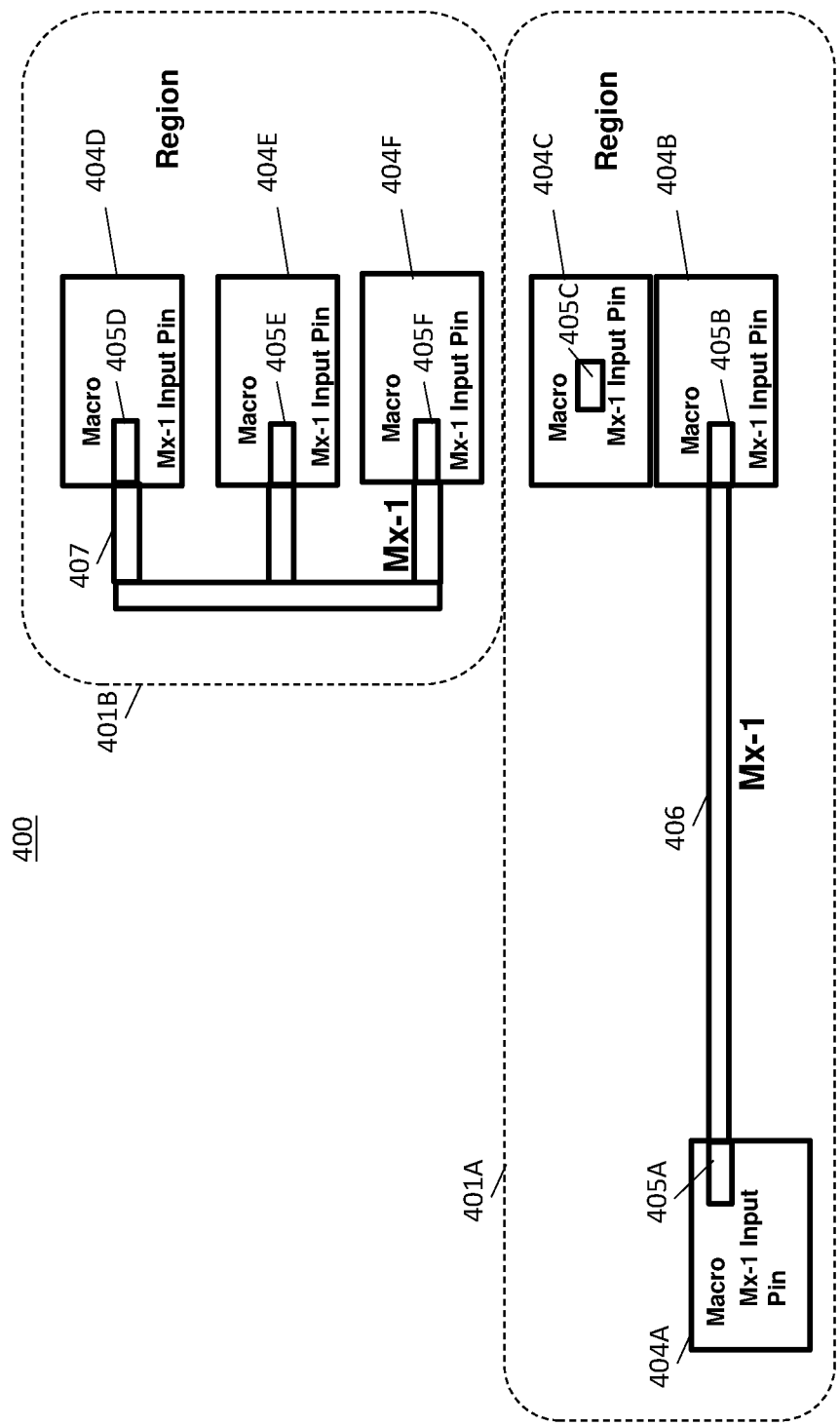
FIG. 4 is a block diagram of a layer of child macros of a design of an integrated circuit according to one or more embodiments of the invention.

FIG. 4 is a block diagram 400 of a layer of child macros 404 of a design of an integrated circuit, such as design 155 of integrated circuit 120 of FIG. 1, according to one or more embodiments. In the example of FIG. 4, a first region 401A can include macros 404A, 404B, 404C. A second region 401B can include macros 404D, 404E, 404F. In this example, metal layers are defined as Mx, where Mx−1 is below Mx, and Mx+1 is above Mx. Each of the macros 404A, 404B, 404C, 404D, 404E, 404F can have a corresponding input pin 405A, 405B, 405C, 405D, 405E, 405F defined in this example at metal layer Mx−1. An initial routing at layer Mx−1 may result in a first route 406 between input pins 405A, 405B of macros 404A, 404B respectively. The initial routing at layer Mx−1 may also result in a second route 407 between input pins 405D, 405E, 405F of macros 404D, 404E, 404F respectively. The connection characteristics of the macros 404A-404F can be defined as shape information in corresponding files 160 of FIG. 1 and used in antenna calculations. In the initial routing, the pin 405C of macro 404C may not yet be connected to a route as each layer is defined. Regions 401A, 401B appear as islands of nets that are not yet connected, because only the Mx−1 layer is being checked in this example. Input pins 405A, 405B are all of the gate/rx area that is currently available to dissipate the electrical charge generated by Mx−1 wiring of route 406. Similarly, input pins 405D, 405E, 405F are all of the gate/rx area that is currently available to dissipate the electrical charge generated by Mx−1 wiring of route 407.

Figure 5:
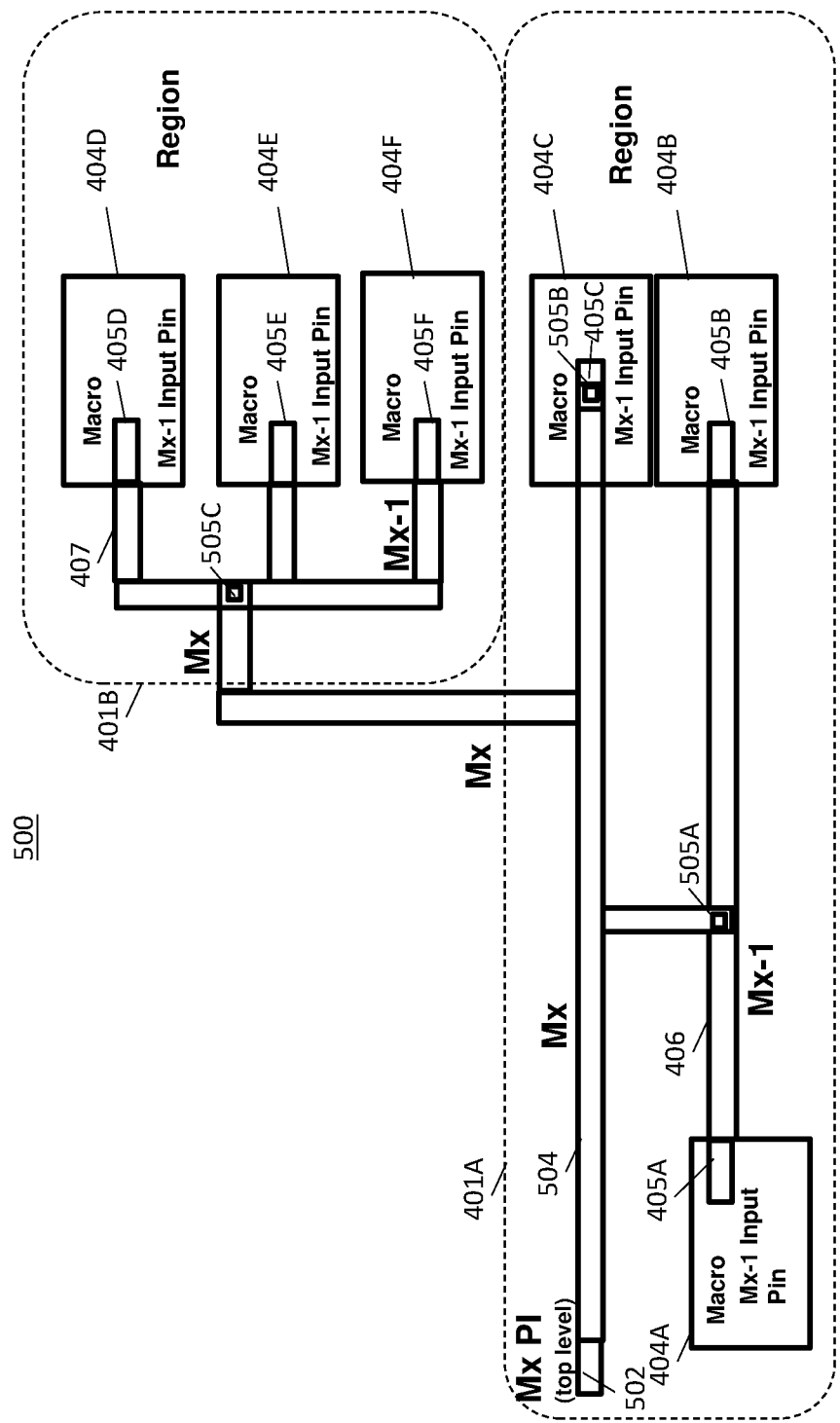
FIG. 5 is a block diagram of multiple layers connecting child macros of a design of an integrated circuit according to one or more embodiments of the invention.

As the macros 404A-404F are connected as child macros to a parent level pin 502 at layer Mx, antenna conditions that were not separately detectable within the macros 404A-404F may appear as depicted in the example of block diagram 500 of FIG. 5. In this example, input pins 405A-405F can act as sink pins driven by a source connected to the parent level pin 502. A route 504 at layer Mx may be coupled to the parent level pin 502 at one end. The route 504 at layer Mx can be coupled to route 406 at layer Mx−1 through a via 505A. The route 504 at layer Mx can be coupled to input pin 405C of macro 404C at layer Mx−1 through a via 505B. The route 504 at layer Mx can be coupled to route 407 at layer Mx−1 through a via 505C. If the connection of route 504 at layer Mx results in the design verification tool 140 of FIG. 1 detecting an antenna condition that violates an antenna rule, one or more adjustments can be made. As one example, rather than making a gate area adjustment within one or more of the macros 404A-404F, a routing adjustment can be made through a parent macro of the macros 404A-404F to split the metal of routes 406 and 504 between different levels as depicted in the example of FIG. 6.

Figure 6:
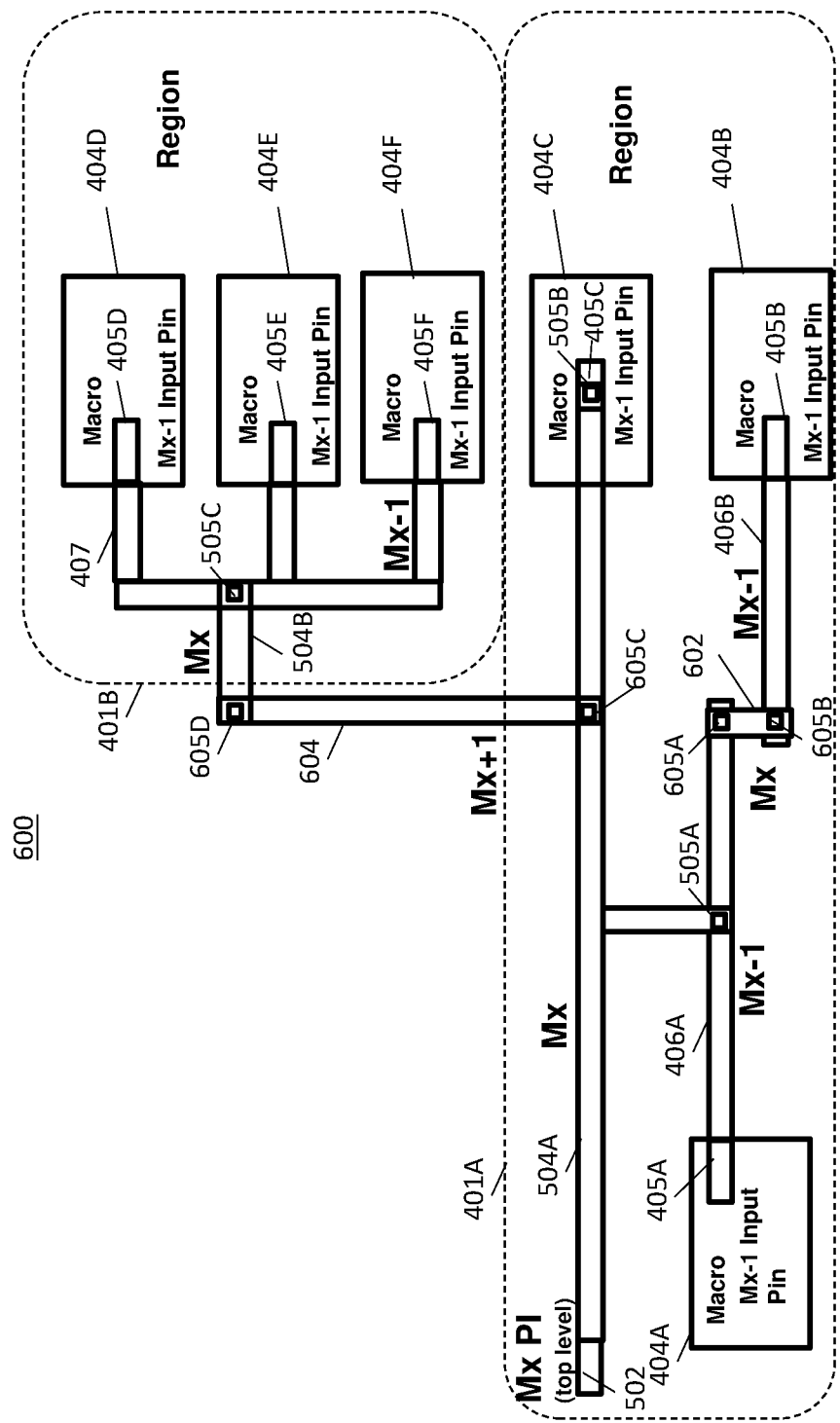
FIG. 6 is a block diagram of multiple layers connecting child macros forming an adjusted route in a design of an integrated circuit according to one or more embodiments of the invention.

Block diagram 600 of FIG. 6 illustrates one possible solution that can be determined by the design verification tool 140 of FIG. 1 to remove one or more antenna rule violations in the design illustrated in block diagram 500 of FIG. 5. In the example of FIG. 6, in response to the design verification tool 140 determining that an antenna rule violations exists for route 406 of FIG. 5 at layer Mx−1, the signal path between macro 404A and macro 404B can be split as route 406A coupled to input pin 405A and route 406B coupled to input pin 405B. Shape information can be used in performing antenna calculations. For example, a jumper 602 can be added at layer Mx with a via 605A coupling jumper 602 to route 406A and a via 605B coupling jumper 602 to route 406B. In order to determine that jumper 602 is needed, the design verification tool 140 can use shape information files from macro 404B and macro 404A to complete the analysis. To reduce the signal path length in the same layer between the first region 401A and the second region 401B, route 504 of FIG. 5 can be split into route 504A and 504B at layer Mx, where route 504A is coupled to parent level pin 502 and input pin 405C through via 505B. A route 604 at layer MX+1 can be coupled to route 504A by a via 605C, and the route 604 can be coupled to route 504B by a via 605D, where route 504B is also coupled to route 407 by via 505C. Alternatively, other design variations could be used to address antenna rule violations at the parent and/or child macros.

Figure 7:
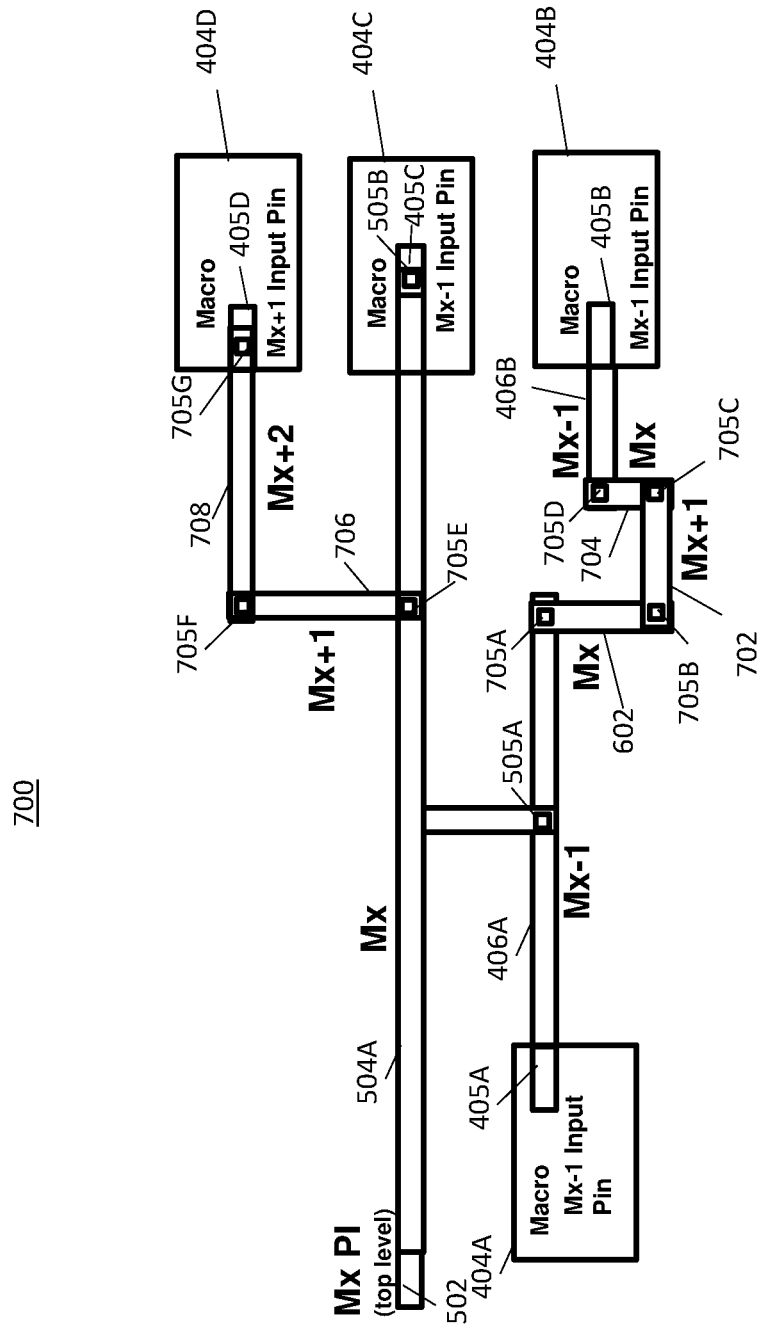
FIG. 7 is a block diagram of multiple layers of child macros connected to form a route in a design of an integrated circuit according to one or more embodiments of the invention.

FIG. 7 is a block diagram 700 of multiple layers of child macros connected to form a route in a design of an integrated circuit according to one or more embodiments, such as integrated circuit 120 of FIG. 1. The example of FIG. 7 depicts a modified design of the block diagram 600 of FIG. 6. Block diagram 700 includes a macro 404A with input pin 405A at layer Mx−1 coupled to route 406A. A multi-layer path is defined between input pin 405A and input pin 405B of macro 404B at layer Mx−1. Jumper 602 at layer Mx can connect to route 406A through via 705A and jumper 702 at layer Mx+1 through via 705B. Jumper 702 at layer Mx+1 can also connect to jumper 704 at layer Mx through via 705C. Jumper 704 can connect to route 406B at layer Mx−1 through via 705D. Route 406A is coupled to route 504A at layer Mx by via 505A. Route 504A is coupled to parent level pin 502 at layer Mx and to input pin 405C of macro 404C at layer Mx−1 by via 505B. Route 504A is also connected to route 706 at layer Mx+1 through via 705E, and route 706 is connected to route 708 at layer Mx+2 through via 705F. Route 708 is connected to input pin 405D of macro 404D at layer Mx+1 through via 705G.

In the example of FIG. 7, the various layers Mx−1, Mx, Mx+1, Mx+2 can be used to determine the order of analysis for the design verification tool 140 of FIG. 1. For example, using a bottoms-up approach to analyze shape information can include examining connections at each pin, such as input pins 405A, 405B, 405C, 405D, and parent level pin 502. In this example, input pins 405A, 405B, 405C of layer Mx−1 would be initially examined for connections, and the results would be stored as shape information in one or more files 160 of FIG. 1. For example, shape information can capture metal area, gate area, and/or diffusion area for each macro 404A, 404B, 404C at target locations associated with each of the connections to the input pins 405A, 405B, 405C. Metal area for routes 406A, 406B can be captured as shape information for a defining connection to input pins 405A, 405B. The analysis can continue at the next layer up for layer Mx and vias connecting layer Mx−1 to Mx. For example, layer Mx analysis may examine shape information of parent level pin 502, route 504A, jumper 602, jumper 704, and vias 505A, 505B, 705A, 705D. At layer Mx+1, the analysis can include macro 404D, input pin 405D, jumper 702, route 706, and vias 705B, 705C, 705E. At layer Mx+2, the analysis can include route 708 and vias 705F, 705G. As each layer Mx−1, Mx, Mx+1, Mx+2 is checked, the analysis performed by the design verification tool 140 of FIG. 1 can also verify that an added layer of connections does not result in an antenna rule violation with respect to connections made at the same layer and at lower layers. For instance, if no antenna rule violations are detected at layer Mx−1, the analysis of layer Mx can include analyzing the combination of layer Mx as connected to layer Mx−1 to ensure new antenna rule violations are not created when connecting with layer Mx. A similar analysis process can be repeated as further layers are added.

Figure 8:
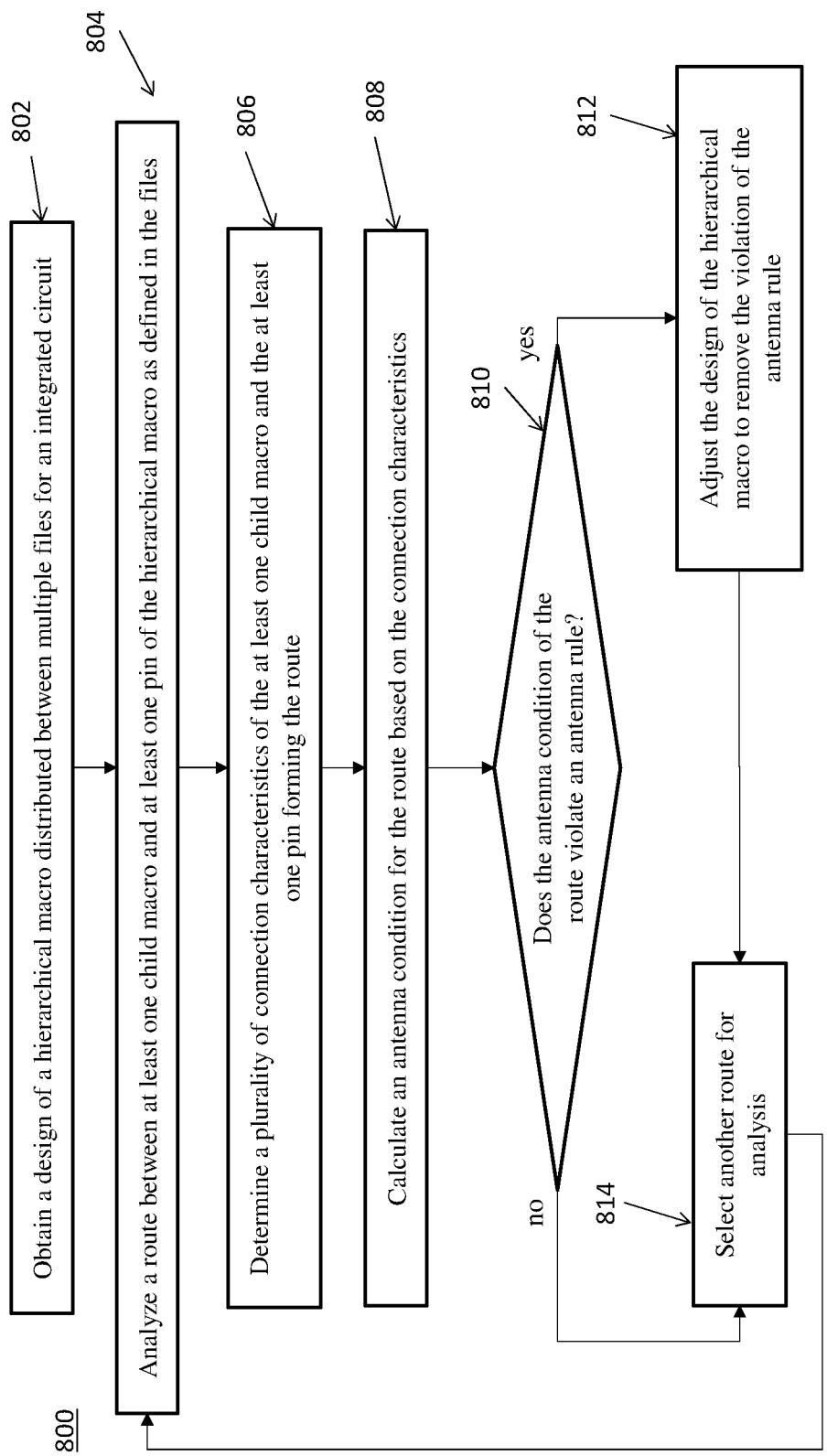
FIG. 8 is a process flow of a method of cross-hierarchy antenna condition verification in the development of an integrated circuit according to one or more embodiments of the invention.

FIG. 8 is a process flow of a method 800 of integrated circuit development using cross-hierarchy antenna condition verification according to exemplary embodiments of the invention. The method 800 is described with respect to FIGS. 1-8. Although the method 800 is depicted in a particular order, it will be understood that some steps may be performed in a different order and may be combined or further divided into additional steps.

The method 800 begins at block 802 by obtaining a design of a hierarchical macro distributed between multiple files for an integrated circuit. For example, the design verification tool 140 can access the design 155 of a hierarchical macro, such as hierarchical macro 300, distributed between multiple files 160 for integrated circuit 120.

Next, as shown at block 804, the method 800 includes analyzing a route between at least one child macro and at least one pin of the hierarchical macro as defined in the files. For example, the design verification tool 140 can analyze route 306 between child macros 304A, 304B through the parent macro 302 of the hierarchical macro 300 as defined in the files 160. As another example, a route can be a parent route 331 that connects child macro 304B to one or more terminals 330 to connect to a higher level in a hierarchy that includes the hierarchical macro 300.

The method 800 also includes determining a plurality of connection characteristics of the at least one child macro and the at least one pin forming the route, as shown at block 806. For example, the design verification tool 140 can determine a plurality of connection characteristics at each of the at least two child macros 304A, 304B and the parent macro 302 forming the route 306. The connection characteristics can include, for instance, a metal area, a via area, a gate area, and a diffusion area of the route 306 spanning two or more layers (e.g., Mx−1, Mx, Mx+1, Mx+2, etc.) of the integrated circuit 120. Connection characteristics can be defined in shape information files to share between layers for antenna condition analysis. For instance, shape information related to child macro 304A can be captured in child shape information file 324A. Similarly, shape information related to child macro 304B can be captured in child shape information file 324B, and shape information related to parent macro 302 can be captured in parent shape information file 326. Shape information can be shared between layers by making the information available to a next lower layer or a next higher layer. Further, parent shape information can be added to a child shape information file, or child shape information can be added to a parent shape information file to support antenna condition analysis and resolution between two or more layers.

The method 800 continues at block 808 by calculating an antenna condition for the route based on the connection characteristics. For example, the design verification tool 140 can calculate an antenna condition for the route 306 based on the connection characteristics at each of the at least two child macros 304A, 304B and the parent macro 302 forming the route 306. Further, the design verification tool 140 can calculate an antenna condition for route 331 based on the connection characteristics at the sink 332 of child macro 304B as connected to one or more terminals 330 of parent macro 302.

Next, as shown at decision block 810, the method 800 includes determining whether an antenna condition of the route violates the antenna rule. For example, the design verification tool 140 can compare a computed value of an antenna condition for route 306 or route 331 to one or more thresholds as defined in the rules 150. The rules 150 can be defined in terms of ratios that compare at least two values, such as metal area to gate area or metal area to the combination of gate area and diffusion area. Other types of rules 150 may be defined in terms of a maximum path length in the same layer or a minimum metal, gate, or diffusion area at a pin acting as a signal sink. Other variations known to result in potential electrostatic discharge damage can be included in the rules 150. For example, certain processing steps, such as an etch step, known to occur during fabrication of the integrated circuit 120 can be used to define one or more of the rules 150.

If the antenna condition of the route does violate an antenna rule, the method 800 proceeds to block 812 and adjusts the design of the hierarchical macro to remove the violation of the antenna rule. Otherwise, the method 800 proceeds to block 814 and another route is selected for evaluation. Adjusting the design of the hierarchical macro can include adding metal to the route such that the antenna rule is satisfied. The addition of metal can be at a different layer of metal, such as using one or more jumpers at different layers to break up long paths within the same layer according to one or more of the rules 150. Adjusting the design of the hierarchical macro can also include expanding a gate area at a child macro of the at least two child macros such that the antenna rule is satisfied. For example, expanding the gate area 318 into a larger area 328 may remove an antenna rule violation at a sink pin 320. Area expansion can be achieved, for instance, through using spare capacity within a child macro or through donation of capacity from the parent macro.

Shape information for each of the at least two child macros 304A, 304B and the parent macro 302 can be separately defined on a per-layer basis for the integrated circuit 120. As such, route evaluation can be performed on a layer-by-layer basis, where the design verification tool 140 performs route analysis from a lower/lowest layer of the route towards a higher layer of the route between at least one pin of the at least two child macros connected by the route. For example, design verification tool 140 can perform an initial analysis at a lowest layer, such as layer Mx−1, and perform a bottoms-up analysis through all connected layers of child macros within a parent macro scope, e.g., Mx, Mx+1, Mx+2, etc.

Figure 9:
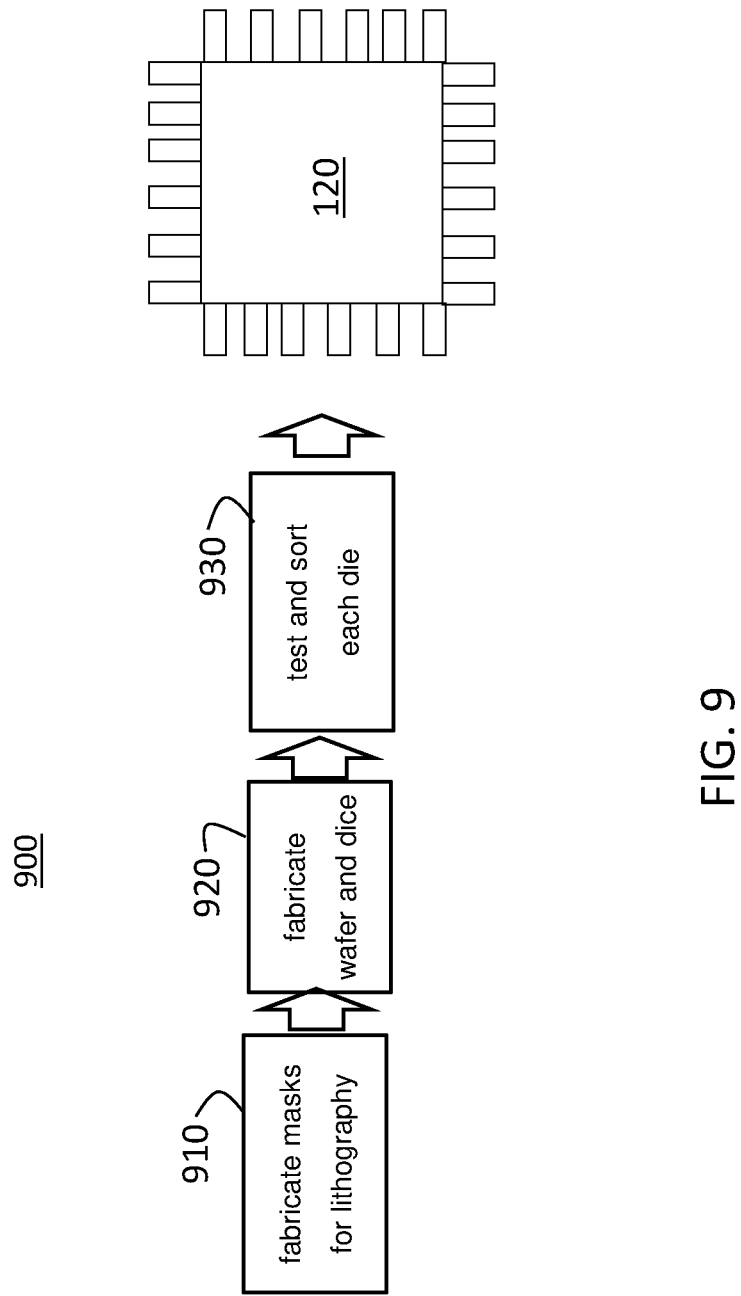
FIG. 9 is a process flow of a method of fabricating the integrated circuit according to exemplary embodiments of the invention.

FIG. 9 is a process flow of a method 900 of fabricating the integrated circuit according to exemplary embodiments of the invention. Once the physical design data is obtained, based, in part, on the processes discussed with reference to FIG. 8, the integrated circuit 120 can be fabricated according to known processes that are generally described with reference to FIG. 9. Generally, a wafer with multiple copies of the final design is fabricated and cut (i.e., diced) such that each die is one copy of the integrated circuit 120. At block 910, the processes include fabricating masks for lithography based on the finalized physical layout. At block 920, fabricating the wafer includes using the masks to perform photolithography and etching. Once the wafer is diced, testing and sorting each die is performed, at block 930, to filter out any faulty die.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
    obtaining a design of a hierarchical macro distributed between multiple files for an integrated circuit, wherein the hierarchical macro comprises a parent macro and a plurality of child macros;
    analyzing, by a design verification tool, a route between at least one child macro of the child macros and at least one pin of the hierarchical macro as defined in the files;
    determining, by the design verification tool, a plurality of connection characteristics of the at least one child macro and the at least one pin forming the route;
    calculating, by the design verification tool, an antenna condition for the route based on the connection characteristics; and
    adjusting, by the design verification tool, the design of the hierarchical macro to remove a violation of an antenna rule based on determining that the antenna condition of the route violates the antenna rule, wherein adjusting comprises:
        generating a parent shape information file as one of the files based on determining that an antenna rule violation fix cannot be made at a parent level of the parent macro;
        modifying the design of the hierarchical macro at a child level of the at least one child macro based on the parent shape information file;
        updating a child shape information file of the files to include a modification of the design of the hierarchical macro; and
        using the child shape information file after updating to run a subsequent parent antenna check.

2. The method of claim 1, wherein a plurality of shape information for the hierarchical macro is defined on a per-layer basis for the integrated circuit.

3. The method of claim 2, wherein the connection characteristics comprise a metal area, a via area, and a gate area of the route spanning two or more layers of the integrated circuit.

4. The method of claim 3, wherein the connection characteristics comprise a diffusion area.

5. The method of claim 1, wherein route analysis is performed from a lower layer of the route towards a higher layer of the route.

6. The method of claim 1, wherein adjusting the design of the hierarchical macro comprises adding metal to the route such that the antenna rule is satisfied.

7. The method of claim 1, wherein adjusting the design of the hierarchical macro comprises expanding a gate area at a child macro of the at least one child macro such that the antenna rule is satisfied.

8. A system comprising:
a memory having computer readable instructions; and
one or more processors for executing the computer readable instructions, the computer readable instructions controlling the one or more processors to perform operations comprising:
obtaining a design of a hierarchical macro distributed between multiple files for an integrated circuit, wherein the hierarchical macro comprises a parent macro and a plurality of child macros;
analyzing a route between at least one child macro of the child macros and at least one pin of the hierarchical macro as defined in the files;
determining a plurality of connection characteristics of the at least one child macro and the at least one pin forming the route;
calculating an antenna condition for the route based on the connection characteristics; and
adjusting the design of the hierarchical macro to remove a violation of an antenna rule based on determining that the antenna condition of the route violates the antenna rule, wherein adjusting comprises:
generating a parent shape information file as one of the files based on determining that an antenna rule violation fix cannot be made at a parent level of the parent macro;
modifying the design of the hierarchical macro at a child level of the at least one child macro based on the parent shape information file;
updating a child shape information file of the files to include a modification of the design of the hierarchical macro; and
using the child shape information file after updating to run a subsequent parent antenna check.

9. The system of claim 8, wherein a plurality of shape information for the hierarchical macro is defined on a per-layer basis for the integrated circuit.

10. The system of claim 9, wherein the connection characteristics comprise a metal area, a via area, and a gate area of the route spanning two or more layers of the integrated circuit.

11. The system of claim 9, wherein the connection characteristics comprise a diffusion area.

12. The system of claim 8, wherein route analysis is performed from a lower layer of the route towards a higher layer of the route.

13. The system of claim 8, wherein adjusting the design of the hierarchical macro comprises adding metal to the route such that the antenna rule is satisfied.

14. The system of claim 8, wherein adjusting the design of the hierarchical macro comprises expanding a gate area at a child macro of the at least one child macro such that the antenna rule is satisfied.

15. A computer program product comprising a non-transitory computer readable storage medium having program instructions embodied therewith, the program instructions executable by a processor to cause the processor to perform operations comprising:
obtaining a design of a hierarchical macro distributed between multiple files for an integrated circuit, wherein the hierarchical macro comprises a parent macro and a plurality of child macros;
analyzing a route between at least one child macro of the child macros and at least one pin of the hierarchical macro as defined in the files;
determining a plurality of connection characteristics of the at least one child macro and the at least one pin forming the route;
calculating an antenna condition for the route based on the connection characteristics; and
adjusting the design of the hierarchical macro to remove a violation of an antenna rule based on determining that the antenna condition of the route violates the antenna rule, wherein adjusting comprises:
generating a parent shape information file as one of the files based on determining that an antenna rule violation fix cannot be made at a parent level of the parent macro;
modifying the design of the hierarchical macro at a child level of the at least one child macro based on the parent shape information file;
updating a child shape information file of the files to include a modification of the design of the hierarchical macro; and
using the child shape information file after updating to run a subsequent parent antenna check.

16. The computer program product of claim 15, wherein a plurality of shape information for the hierarchical macro is defined on a per-layer basis for the integrated circuit.

17. The computer program product of claim 16, wherein the connection characteristics comprise a metal area, a via area, diffusion area, and a gate area of the route spanning two or more layers of the integrated circuit.

18. The computer program product of claim 15, wherein route analysis is performed from a lower layer of the route towards a higher layer of the route.

19. The computer program product of claim 15, wherein adjusting the design of the hierarchical macro comprises adding metal to the route such that the antenna rule is satisfied.

20. The computer program product of claim 15, wherein adjusting the design of the hierarchical macro comprises expanding a gate area at a child macro of the at least one child macro such that the antenna rule is satisfied.

\* \* \* \* \*